United States Patent
Yu et al.

(10) Patent No.: US 9,385,737 B1
(45) Date of Patent: Jul. 5, 2016

(54) ADAPTIVE CORRECTION OF INTERLEAVING ERRORS IN TIME-INTERLEAVED ANALOG-TO-DIGITAL CONVERTERS

(71) Applicant: Maxim Integrated Products, Inc., San Jose, CA (US)

(72) Inventors: Qian Yu, Santa Clara, CA (US); Shayan Farahvash, Kensington, CA (US)

(73) Assignee: Maxin Integrated Products, Inc., San Jose, CA (US)

(*) Notice: Subject to any disclaimer, the term of this patent is extended or adjusted under 35 U.S.C. 154(b) by 0 days.

(21) Appl. No.: 14/681,604

(22) Filed: Apr. 8, 2015

Related U.S. Application Data (60) Provisional application No. 62/090,686, filed on Dec. 11, 2014.

(51) Int. Cl.
 H03M 1/12 (2006.01)
 H03M 1/06 (2006.01)
 H03M 1/38 (2006.01)
 H03M 1/10 (2006.01)

(52) U.S. Cl.
 CPC .......... *H03M 1/0624* (2013.01); *H03M 1/0626* (2013.01); *H03M 1/1028* (2013.01); *H03M 1/12* (2013.01); *H03M 1/38* (2013.01)

(58) Field of Classification Search
 CPC ... H03M 1/0624; H03M 1/10; H03M 1/1028; H03M 1/12
 USPC .......................................... 341/120, 155, 141
 See application file for complete search history.

(56) References Cited

U.S. PATENT DOCUMENTS

| | | | |
|---|---|---|---|
| 5,239,299 A | 8/1993 | Apple et al. | |
| 5,933,039 A | 8/1999 | Hui et al. | |
| 6,473,013 B1 | 10/2002 | Velazquez et al. | |
| 7,348,914 B1 | 3/2008 | Hazanchuk et al. | |
| 7,576,666 B2 | 8/2009 | Mayrench et al. | |
| 7,916,051 B1* | 3/2011 | Sestok | 341/120 |
| 8,193,963 B2 | 6/2012 | Wang et al. | |
| 8,519,875 B2* | 8/2013 | Straayer et al. | 341/120 |
| 8,618,972 B1 | 12/2013 | Na et al. | |
| 8,698,659 B2* | 4/2014 | Hovakimyan | H03M 1/0626 341/118 |
| 8,730,072 B2* | 5/2014 | Petigny et al. | 341/120 |
| 8,872,680 B2* | 10/2014 | Ali | H03M 1/10 341/118 |
| 8,917,125 B1* | 12/2014 | Waltari | 327/147 |
| 9,172,388 B1* | 10/2015 | Stein | H03M 1/0609 |
| 2005/0062482 A1 | 3/2005 | Vincent et al. | |
| 2006/0061399 A1 | 3/2006 | Xu et al. | |
| 2006/0066368 A1 | 3/2006 | Gabato et al. | |
| 2008/0290924 A1 | 11/2008 | Gonzalez et al. | |
| 2012/0013493 A1 | 1/2012 | Kato | |

OTHER PUBLICATIONS

U.S. Appl. No. 62/114,305, filed Feb. 10, 2015.
U.S. Appl. No. 14/721,287, filed May 26, 2015, Yu et al.

* cited by examiner

*Primary Examiner* — Brian Young

(57) ABSTRACT

A system includes an interleaved analog-to-digital converter (ADC) comprising a plurality of sub-ADCs, where each of the plurality of sub-ADCs has an adjustable timing. The system includes a data analyzer that analyzes an output of the interleaved ADC, that estimates timing mismatches of the plurality of sub-ADCs, and that corrects the timing mismatches by adjusting the adjustable timing of one or more of the plurality of sub-ADCs based on the estimated timing mismatches.

23 Claims, 8 Drawing Sheets

ADAPTIVE CORRECTION OF INTERLEAVING ERRORS IN TIME-INTERLEAVED ANALOG-TO-DIGITAL CONVERTERS

CROSS-REFERENCE TO RELATED APPLICATIONS

This application claims the benefit of U.S. Provisional Application No. 62/090,686 filed on Dec. 11, 2014. The entire disclosures of the applications referenced above are incorporated herein by reference.

FIELD

The present disclosure relates to analog-to-digital converters (ADCs), and more particularly to systems and methods for correcting interleaving errors in ADCs.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A time-interleaved analog-to-digital converter (ADC) includes multiple sub-ADCs that operate in parallel. Interleaving errors may be caused by mismatch in the parallel sub-ADCs. More particularly, the parallel sub-ADCs of the time-interleaved ADC have offset, gain, and timing mismatches. For high speed ADCs operating with radio-frequency (RF) input signals, the timing mismatch may be a particularly challenging problem.

SUMMARY

A system comprises an interleaved analog-to-digital converter (ADC) and a data analyzer. The interleaved ADC comprises a plurality of sub-ADCs. Each of the plurality of sub-ADCs has an adjustable timing. The data analyzer analyzes an output of the interleaved ADC, estimates timing mismatches of the plurality of sub-ADCs, and corrects the timing mismatches by adjusting the adjustable timing of one or more of the plurality of sub-ADCs based on the estimated timing mismatches.

In other features, the data analyzer comprises first and second linear phase finite impulse response (FIR) filters and a correlator. The first linear phase FIR filter has symmetric coefficients, receives the output of the interleaved ADC, and generates a first filtered output. The second linear phase FIR filter has asymmetric coefficients, receives the output of the interleaved ADC, and generates a second filtered output. The correlator generates the estimated timing mismatches based on the first and second filtered outputs. The first and second linear phase FIR filters have an odd number FIR length. The second linear phase FIR filter has a shorter FIR length than the first linear phase FIR filter. The data analyzer delays the second filtered output by an integer number of samples to synchronize the first and second filtered outputs.

In other features, the data analyzer comprises a multi-band-stop filter, a multi-band differentiator, and a correlator. The multi-band-stop filter has symmetric coefficients, receives the output of the interleaved ADC, selects one or more out-of-band components of output of the interleaved ADC, and generates a first output. The multi-band differentiator has asymmetric coefficients, receives the output of the interleaved ADC, rejects the one or more out-of-band components of the output of the interleaved ADC, shifts a phase of one or more in-band components of the output of the interleaved ADC, and generates a second output. The correlator generates the estimated timing mismatches based on the first and second outputs. The multi-band-stop filter and the multi-band differentiator have the same finite impulse response (FIR) length. The second output includes a derivative an input of the interleaved ADC.

In other features, the data analyzer comprises a multi-band-stop filter, a wideband differentiator, and a correlator. The multi-band-stop filter has symmetric coefficients, receives the output of the interleaved ADC, selects out-of-band components of output of the interleaved ADC, and generates a first output. The wideband differentiator has asymmetric coefficients, receives the output of the interleaved ADC, and generates a second output. The correlator generates the estimated timing mismatches based on the first and second outputs. The wideband differentiator has a shorter finite impulse response (FIR) length than the multi-band-stop filter. The data analyzer delays the second output by an integer number of samples to synchronize the first and second outputs.

In other features, the data analyzer comprises a finite impulse response (FIR) differentiator and a correlator. The FIR differentiator has asymmetric coefficients, receives the output of the interleaved ADC, and generates a first output. The correlator generates the estimated timing mismatches based on the first output and a delayed output of the interleaved ADC. the data analyzer generates the delayed output by delaying the output of the interleaved ADC by an integer number of samples. The FIR differentiator includes a multi-band differentiator that rejects out-of-band components of the output of the interleaved ADC and that shifts a phase of in-band components of the output of the interleaved ADC. The FIR differentiator includes a wideband differentiator in response to bands of an input of the interleaved ADC being within a single Nyquist zone.

In other features, the data analyzer comprises a multi-band-stop filter, a multi-band differentiator, and first and second correlators. The multi-band-stop filter has symmetric coefficients, receives the output of the interleaved ADC, selects one or more out-of-band components of output of the interleaved ADC, and generates a first output. The multi-band differentiator has asymmetric coefficients, receives the output of the interleaved ADC, rejects the one or more out-of-band components of the output of the interleaved ADC, shifts a phase of one or more in-band components of the output of the interleaved ADC, and generates a second output. The first correlator generates the estimated timing mismatches based on the first and second outputs. The second correlator generates the estimated timing mismatches based on the second output and a delayed output of the interleaved ADC in response to bands of an input of the interleaved ADC being within a single Nyquist zone. The data analyzer generates the delayed output by delaying the output of the interleaved ADC by an integer number of samples.

In other features, the data analyzer comprises a multi-band-stop filter, a wideband differentiator, and first and second correlators. The multi-band-stop filter has symmetric coefficients, receives the output of the interleaved ADC, selects out-of-band components of output of the interleaved ADC, and generates a first output. The wideband differentiator has asymmetric coefficients, receives the output of the interleaved ADC, and generates a second output. The first correlator generates the estimated timing mismatches based on the first and second outputs. The second correlator generates the estimated timing mismatches based on the second output and a delayed output of the interleaved ADC in response to bands of an input of the interleaved ADC being within a single Nyquist zone. The data analyzer generates the delayed output by delaying the output of the interleaved ADC by an integer number of samples.

In other features, the data analyzer comprises a multi-band-stop filter and a correlator. The multi-band-stop filter has symmetric coefficients, receives the output of the interleaved ADC, selects out-of-band components of output of the interleaved ADC, and generates a first output. The correlator estimates a gain mismatch of the plurality of sub-ADCs based on the first output and a delayed output of the interleaved ADC. The data analyzer generates the delayed output by delaying the output of the interleaved ADC by an integer number of samples.

In other features, each of the plurality of sub-ADCs has an adjustable gain. The data analyzer analyzes the output of the interleaved ADC, estimates gain mismatches of the plurality of sub-ADCs, and corrects the gain mismatches by adjusting the adjustable gain of one or more of the plurality of sub-ADCs based on the estimated gain mismatches.

In other features, the interleaved ADC samples an input at a sampling frequency. The system further comprises a converter that converts the sampling frequency into a predetermined frequency and that changes the sampling frequency without changing the predetermined frequency in response to the input including an unwanted signal at a multiple of the sampling frequency.

In other features, the converter changes the sampling frequency by a predetermined amount. The system further comprises a phase-locked loop (PLL) frequency synthesizer, first and second frequency dividers, and a frequency shifter. The PLL frequency synthesizer includes a voltage controlled oscillator (VCO) to generate clock signals for the interleaved ADC and the converter. The first frequency divider divides an output of the PLL frequency synthesizer by a predetermined value to generate a first clock signal for the converter. The frequency shifter shifts a frequency of the output of the PLL frequency synthesizer by a predetermined amount. The second frequency divider divides an output of the frequency shifter by the predetermined value to generate a second clock signal for the converter.

In still other features, a method comprises analyzing an output of an interleaved analog-to-digital converter (ADC), wherein the interleaved ADC comprises a plurality of sub-ADCs, and where each of the plurality of sub-ADCs has an adjustable timing. The method further comprises estimating timing mismatches of the plurality of sub-ADCs based on the analyzing of the output of the interleaved ADC, and correcting the timing mismatches by adjusting the adjustable timing of one or more of the plurality of sub-ADCs based on the estimated timing mismatches.

In other features, the analyzing of the output of the interleaved ADC comprises filtering the output of the interleaved ADC using a first filter to generate a first filtered output, filtering the output of the interleaved ADC using a second filter to generate a second filtered output, and correlating the first and second filtered outputs to generate the estimated timing mismatches. The first and second filters include first and second linear phase finite impulse response (FIR) filter having symmetric and asymmetric coefficients. Alternatively, the first and second filters respectively include a multi-band-stop filter having symmetric coefficients that selects one or more out-of-band components of output of the interleaved ADC, and a second linear phase finite impulse response (FIR) filter having symmetric and asymmetric coefficients that rejects the one or more out-of-band components of the output of the interleaved ADC and that shifts a phase of one or more in-band components of the output of the interleaved ADC. Alternatively, the first and second filters respectively include a multi-band-stop filter having symmetric coefficients that selects out-of-band components of output of the interleaved ADC and a wideband differentiator having asymmetric coefficients.

In other features, the analyzing of the output of the interleaved ADC comprises filtering the output of the interleaved ADC using a finite impulse response (FIR) differentiator having asymmetric coefficients to generate a first output, and correlating the first output and a delayed output of the interleaved ADC to generate the estimated timing mismatches. The FIR differentiator includes a multi-band differentiator that rejects out-of-band components of the output of the interleaved ADC and that shifts a phase of in-band components of the output of the interleaved ADC. Alternatively, the FIR differentiator includes a wideband differentiator in response to bands of an input of the interleaved ADC being within a single Nyquist zone.

In other features, the analyzing of the output of the interleaved ADC comprises filtering the output of the interleaved ADC using a multi-band-stop filter having symmetric coefficients that selects one or more out-of-band components of output of the interleaved ADC to generate a first output. The method further comprises filtering the output of the interleaved ADC using a multi-band differentiator having asymmetric coefficients that rejects the one or more out-of-band components of the output of the interleaved ADC and that shifts a phase of one or more in-band components of the output of the interleaved ADC to generate a second output. The method further comprises correlating the first and second outputs to generate the estimated timing mismatches. The method further comprises correlating, in response to bands of an input of the interleaved ADC being within a single Nyquist zone, the second output and a delayed output of the interleaved ADC to generate the estimated timing mismatches.

In other features, the analyzing of the output of the interleaved ADC comprises filtering the output of the interleaved ADC using a multi-band-stop filter having symmetric coefficients that selects out-of-band components of output of the interleaved ADC to generate a first output. The method further comprises filtering the output of the interleaved ADC using a wideband differentiator having asymmetric coefficients to generate a second output. The method further comprises correlating the first and second outputs to generate the estimated timing mismatches. The method further comprises correlating, in response to bands of an input of the interleaved ADC being within a single Nyquist zone, the second output and a delayed output of the interleaved ADC to generate the estimated timing mismatches.

In other features, the analyzing of the output of the interleaved ADC comprises filtering the output of the interleaved ADC using a multi-band-stop filter having symmetric coefficients that selects out-of-band components of output of the interleaved ADC to generate a first output. The method further comprises correlating the first output and a delayed output of the interleaved ADC to estimate a gain mismatch of the plurality of sub-ADCs.

In other features, each of the plurality of sub-ADCs has an adjustable gain. The method further comprises estimating gain mismatches of the plurality of sub-ADCs based on the analyzing of the output of the interleaved ADC, and correcting the gain mismatches by adjusting the adjustable gain of one or more of the plurality of sub-ADCs based on the estimated gain mismatches.

In other features, the interleaved ADC samples an input at a sampling frequency. The method further comprises converting the sampling frequency into a predetermined frequency, and changing the sampling frequency without changing the predetermined frequency in response to the input including an unwanted signal at a multiple of the sampling frequency.

In other features, the method further comprises dividing an output of a phase-locked loop (PLL) frequency synthesizer by a predetermined value to generate a first clock signal for a converter that changes the sampling frequency. The method further comprises generating a second clock signal for the interleaved ADC by shifting a frequency of the output of the PLL frequency synthesizer by a predetermined amount and dividing the frequency-shifted output of the PLL frequency synthesizer by the predetermined value.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

As described above, the parallel sub-ADCs of the time-interleaved ADC may have offset, gain, and timing mismatches. The present disclosure relates to systems and methods for digitally-controlled mixed-signal correction of interleaving errors based on blind detection of sub-ADC mismatches directly from ADC output data.

In a mixed-signal approach to timing mismatch correction, ADCs are designed such that each sub-ADC has digitally adjustable timing. Digital feedback control is used to automatically adjust the sub-ADC timing. The digital control is based on blind detection. The sub-ADC mismatches are estimated from statistics of ADC data during normal data conversion.

The present disclosure employs blind detection and feedback control. The ADC according to the present disclosure has high detection accuracy of sub-ADC mismatches, fast and stable convergence of feedback control, low-complexity digital circuits with low power consumption, and support for ADCs with an arbitrary number of parallel sub-ADCs.

Figure 1:
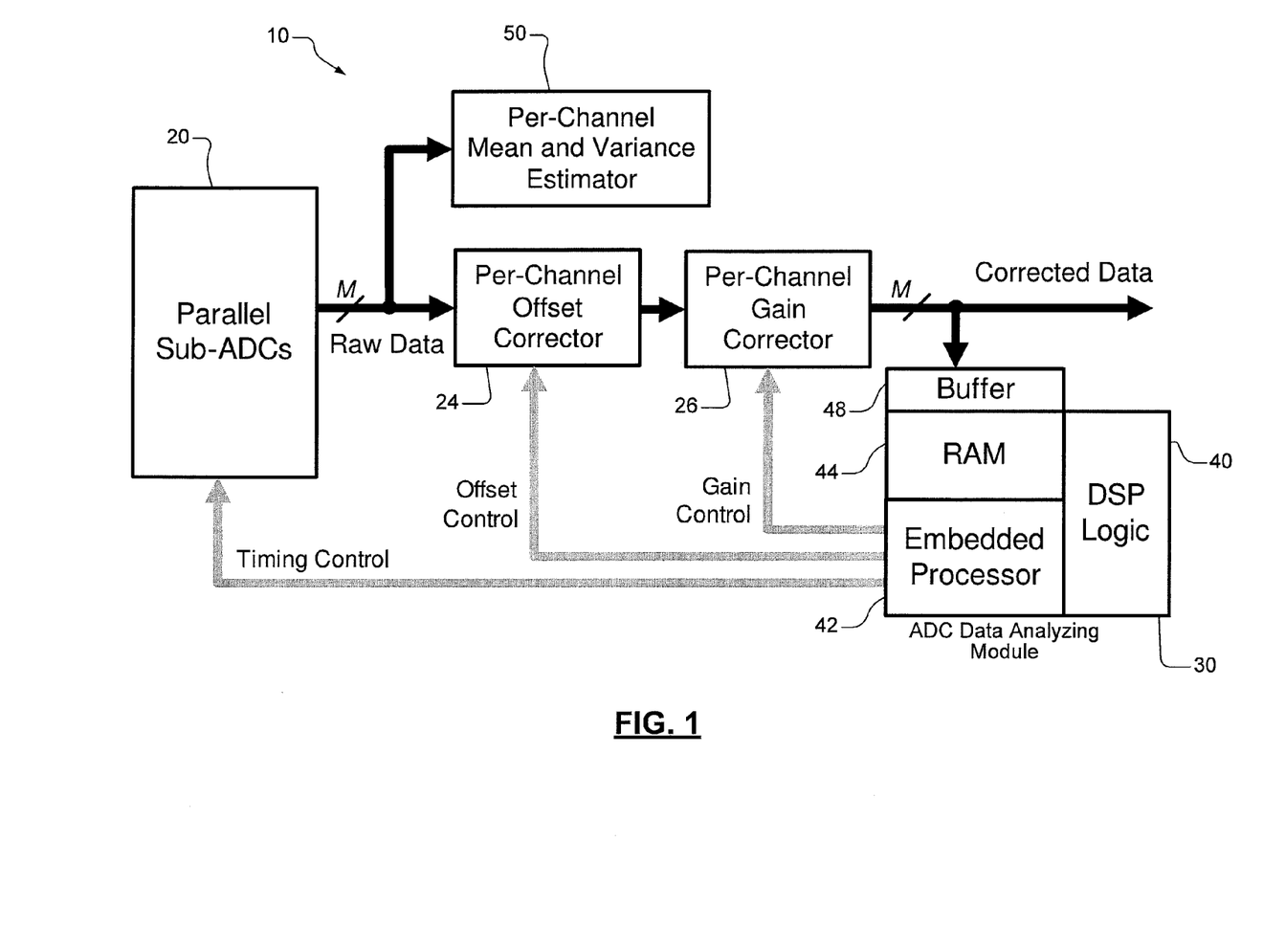
FIG. 1 is a functional block diagram of an example of an analog-to-digital converter (ADC) system according to the present disclosure.

Referring now to FIG. 1, an ADC system 10 is shown. The ADC system 10 includes M parallel sub-ADCs 20 that output M channels of raw data to an offset corrector 24, where M is an integer greater than one. An output of the offset corrector 24 is input to a gain corrector 26. The offset corrector 24 and the gain corrector 26 may operate on a per-channel basis. In other words, M sets of raw data (one set for each channel) are input to the offset corrector 24. The gain corrector 26 outputs M sets of corrected data.

An ADC data analyzing module 30 receives the M sets of corrected data and outputs a timing control signal to the M parallel sub-ADCs 20, an offset control signal to the offset corrector 24, and a gain control signal to the gain corrector 26. In some examples, the ADC data analyzing module 30 may include a digital signal processing (DSP) logic 40, an embedded processor 42, memory 44 such as RAM, and a buffer 48, although other architectures may be used. A mean-and-variance estimator 50 receives the raw data and generates mean and variance values.

In some examples, mixed signal circuits of the time-interleaved ADC system 10 are integrated with digital circuits of interleaving error detection and correction on a mixed-signal system-on-chip. The time-interleaved ADC system 10 uses multiple sub-ADCs running in parallel. The number of the parallel sub-ADCs 20, denoted by M, may be in a range from 2 to 32, although additional sub-ADCs may be used. The ADCs are designed such that each of the parallel sub-ADCs 20 has digitally adjustable timing. In some examples, CMOS inverters with DAC-voltage controlled loading capacitance may be used as variable delay lines for sub-ADC clock signals. In some examples, varactor diodes may be used as voltage-controlled capacitors.

The raw output data of the sub-ADCs 20 include M parallel channels, each channel corresponding to one of the parallel sub-ADCs 20. The raw data can be represented as a vector-valued sequence with a sampling rate equal to the sub-ADC sampling rate, $F_s/M$, where $F_s$ is the interleaved ADC rate. The offset and gain mismatches are corrected in the digital domain. In some examples, the offset corrector 24 performs element-wise addition of an offset vector with the raw data. In some examples, the gain corrector 26 performs element-wise multiplication of a gain vector with the offset corrected data. In some examples, the mean-and-variance estimator 50 performs moving-average measurement of the mean and variance of each channel M.

The ADC data analyzing module 30 may include a digital subsystem that includes the embedded processor 42, the memory 44 and the buffer 48, and dedicated circuits for digital signal processing (DSP) (the DSP logic 40). Data analysis and digital control may be accomplished by embedded software with hardware acceleration by the DSP logic 40.

Figure 2:
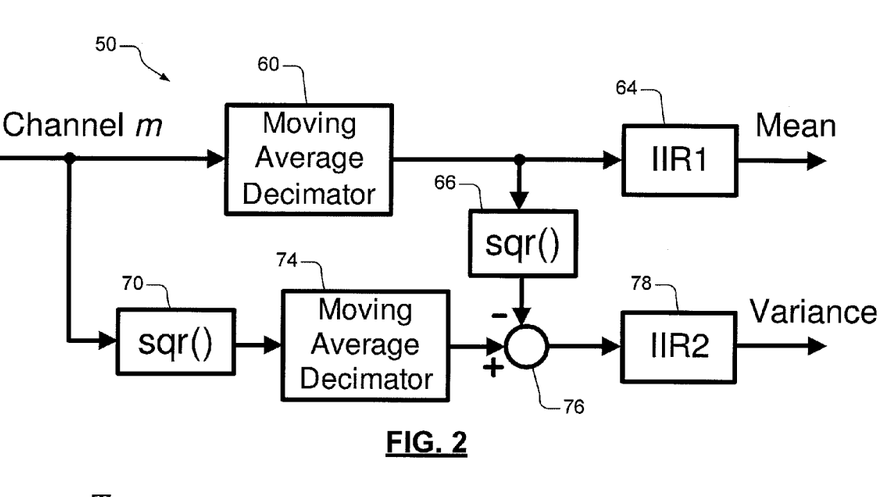
FIG. 2 is a functional block diagram of an example of a mean-and-variance estimator according to the present disclosure.

Referring now to FIG. 2, the mean-and-variance estimator 50 is shown in further detail. A moving average decimator 60 of the mean-and-variance estimator 50 receives an output m corresponding to one of the M channels. An output of the moving average decimator 60 is input to a first infinite impulse response (IIR) filter 64 and a squaring circuit 66. An output of the first IIR filter 64 provides a mean. Another squaring circuit 70 of the mean-and-variance estimator 50 receives the output m corresponding to one of the M channels. An output of the squaring circuit 70 is input to a moving average decimator 74. A non-inverting input of a summer 76 receives an output of the moving average decimator 74. An inverting input of the summer 76 receives an output of the squaring circuit 66. An output of the summer 76 is input to a second IIR filter 78, which outputs variance.

The mean-and-variance estimator 50 may include M single-channel estimators. In FIG. 2, a single-channel estimator is shown. The moving average decimators 60 and 74 and the IIR filters 64 and 78 are used to achieve two-stage averaging. In some examples, the variance is the mean of square minus the square of mean.

In a moving average decimator, a resettable integrator is used to compute the arithmetic average of every $2^K$ samples of the decimator input sequence. The decimation factor is $2^K$, with K corresponding to a programmable integer. The decimator input sampling rate is $F_s/M$, and the output sampling rate is $F_s/(2^K M)$. The transfer function of a first-order IIR filter is given by:

$$H_{IIR}(z) = \frac{2^{-N}}{1-(1-2^{-N})z^{-1}} \quad (1)$$

where N is another programmable integer. The sampling rate of the IIR filter is $F_s/(2^K M)$. Very long time averaging may be realized by two-stage averaging, which has an effective time constant of $2^{K+N} M/Fs$. In addition, the moving average decimators 60 and 74 and the IIR filters 64 and 78 may have efficient fixed-point logic designs without using a multiplier.

Figure 3:
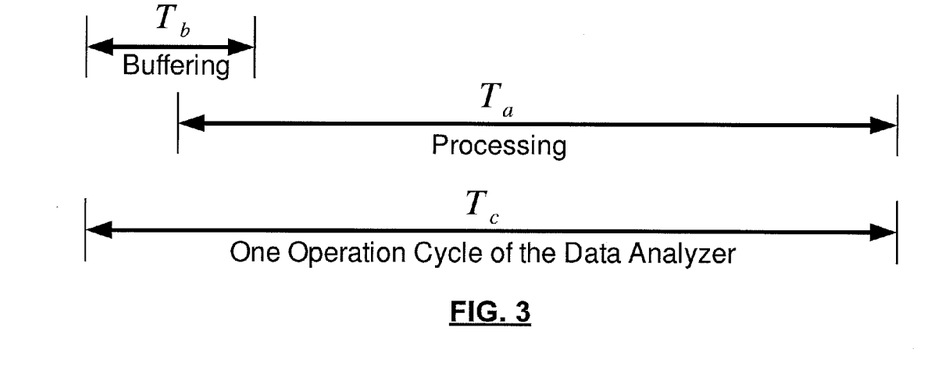
FIG. 3 is a timing diagram illustrating an example of a buffering-processing cycle according to the present disclosure.

Referring now to FIG. 3, the ADC data analyzing module 30 can capture a number of consecutive ADC samples and save the data segment in memory. Static random access memory (SRAM) may be used as embedded memory. FIG. 3 shows an operation cycle (referred to as the buffering-processing cycle) of the ADC data analyzing module 30. The duration of one cycle is denoted by $T_c$. The data includes M parallel channels. Therefore, a segment of data may be treated as a two-dimensional array y(i,m) with i=0, . . . , I−1 and m=0, . . . , M−1.

The data are actually stored in memory as a one-dimensional array y(k) with k=iM+m. The array y(k) is the interleaved sequence, whose sampling rate is the interleaved-ADC rate $F_s$. Because a data segment has IM samples, the duration for data buffering is given by $T_b$=IM/$F_s$. The time duration for processing/analyzing a data segment is denoted by $T_a$. Because data analysis may start before the full segment is saved into RAM, $T_b<T_c\leq(T_a+T_b)$.

Figure 4:
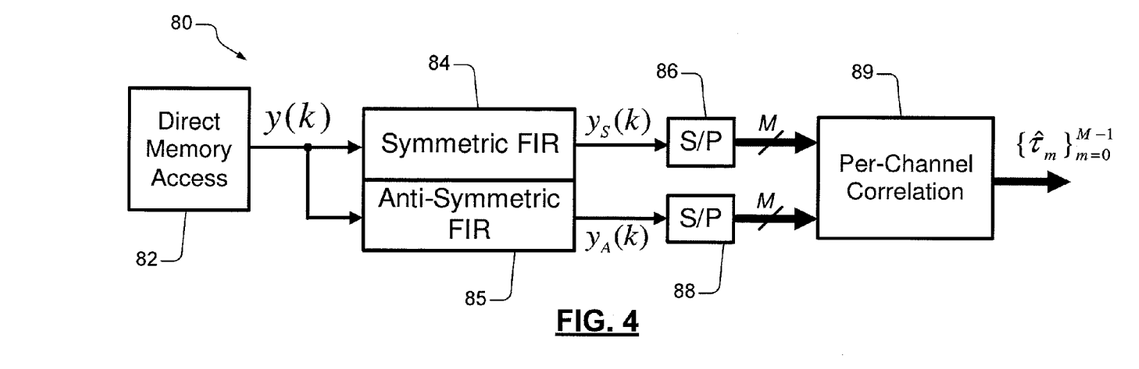
FIG. 4 is a functional block diagram an example of a blind timing skew detector according to the present disclosure.

Referring now to FIG. 4, a blind timing skew estimator 80 includes a direct memory access 82 that outputs an array y(k) to symmetric finite impulse response (FIR) filter 84 (which outputs an array $y_S(k)$) and to an anti-symmetric FIR filter 85 (which outputs an array $y_A(k)$). The array $y_S(k)$ is input to a serial-to-parallel converter 86 having an output connected to a correlator 89. The array $y_A(k)$ is input to a serial-to-parallel converter 88 having an output connected to the correlator 89.

The ADC data analyzing module 30 employs a number of DSP modules. In some examples, embedded software combined with acceleration hardware may be used to implement the DSP modules. For example only, one such module is a power spectral density (PSD) estimator using fast Fourier transforms (FFT) and Welch's averaged periodogram method. A hardware FFT block is used to accelerate the computation. Hardware implementation of the entire PSD estimator is also an option.

FIG. 4 shows a method for blind timing skew detection. Direct memory access (DMA) is used to retrieve the y(k) array and send the data as an input sequence to a pair of linear-phase finite impulse response (FIR) filters. The symmetric FIR filter 84 has symmetric coefficients and the anti-symmetric FIR filter 85 has anti-symmetric coefficients. In some examples, the pair of linear phase FIR filters has the same group delay. The output sequences of the symmetric and the anti-symmetric FIR filters 84 and 85 are denoted by $y_S(k)$ and $y_A(k)$, respectively. In some examples, the starting transient of FIR output may be discarded. Per-channel timing skew, denoted by a vector $\{\tau_m\}_{m=0}^{M-1}$, is estimated from serial-to-parallel (S/P) conversion followed by per-channel correlation between the outputs of the FIR filters 84 and 85. The estimation result $\hat{\tau}_m$ can be expressed as:

$$\hat{\tau}_m = \frac{\underset{i}{\text{Mean}}\{y_S(iM+m)y_A(iM+m)\}}{\underset{i}{\text{Mean}}\{y_A^2(iM+m)\}}, \text{ for } m=0,\ldots,M-1 \quad (2)$$

where i=floor(k/M) and $$\underset{i}{\text{Mean}}\{\ \}$$

is arithmetic averaging over the i-index.

There are four types of real coefficient and linear phase FIR filters: type-I (odd number FIR length, symmetric coefficients), type-II (even number FIR length, symmetric coefficients), type-III (odd number FIR length, anti-symmetric coefficients), and type-IV (even number FIR length, anti-symmetric coefficients).

Typically, the FIR filters 84 and 85 in the timing skew estimator 80 use the combination of a type-I filter with a type-III filter. The FIR filters 84 and 85 can have different FIR length. When this is the case, the shorter FIR output is delayed by an integer number of samples to achieve delay matching with the longer FIR.

Figure 5A:
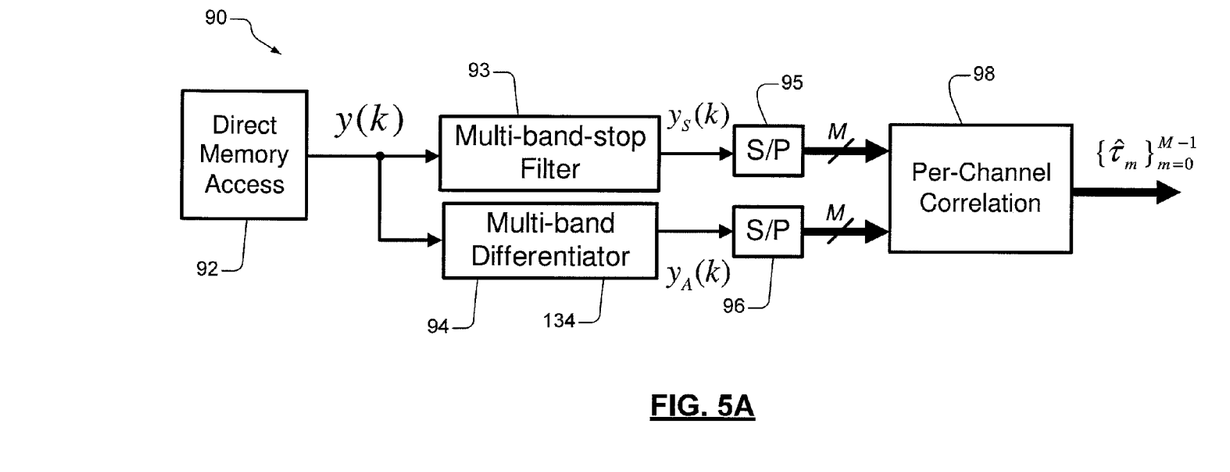
FIGS. 5A, 5B, and 6 are functional block diagrams of examples of timing skew estimators according to the present disclosure.
Figure 5B:
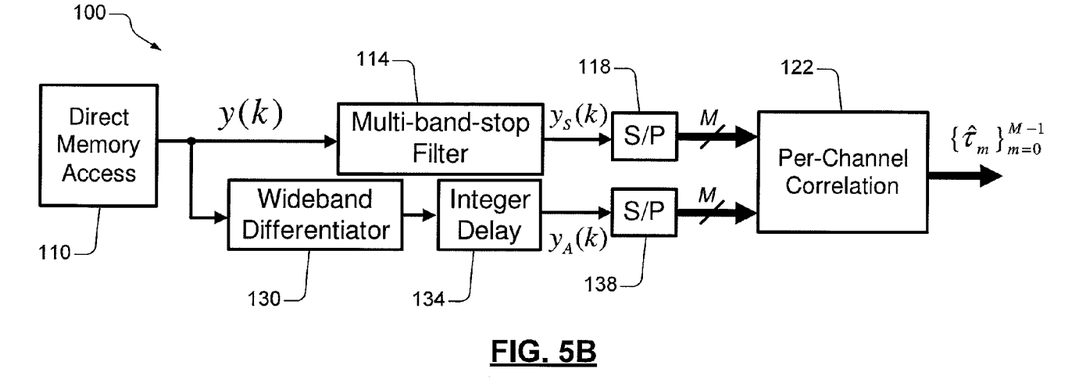

Referring now FIGS. 5A and 5B, timing skew estimators 90 and 100 are shown. In FIG. 5A, the timing skew estimator 90 includes a direct memory access 92 that outputs an array y(k) to a multi-band-stop filter 93 (which outputs an array $y_S(k)$) and to a multi-band differentiator 94 (which outputs an array $y_A(k)$). The array $y_S(k)$ is input to a serial-to-parallel converter 95 having an output connected to a correlator 98. The array $y_A(k)$ is input to a serial-to-parallel converter 96 having an output connected to the correlator 98.

In FIG. 5B, a timing skew estimator 100 includes a direct memory access 110 that outputs an array y(k) to a multi-band-stop filter 114 (which outputs an array $y_S(k)$) and to a wideband differentiator 130 having an output connected to an integer delay 134 (which outputs an array $y_A(k)$). The array $y_S(k)$ is input to a serial-to-parallel converter 118 having an output connected to a correlator 122. The array $y_A(k)$ is input to a serial-to-parallel converter 138 having an output connected to the correlator 122.

In general, ADC input signals are multi-band RF signals. In FIGS. 5A and 5B, the multi-band-stop filters 93 and 114 may be a type-I linear phase FIR, whose stop bands are frequency regions where the y(k) sequence has significant power spectral density (PSD). The significant-PSD regions, or in-band regions, can be identified by comparing the PSD with a threshold. The multi-band-stop filters 93 and 114 select the out-of-band components of the y(k) sequence.

In FIG. 5A, the wideband differentiator 130 may be a type-III linear phase FIR, which rejects out-of-band components of the y(k) sequence and applies 90-degree phase shift to in-band components. The magnitude response of the wideband differentiator 130 is designed so that the FIR output is approximately the derivative of ADC input signal. The wideband differentiator 130 may have identical FIR length as the multi-band-stop filter 114.

In FIG. 5B, the wideband differentiator 130 may also be a type III linear phase FIR. In some examples, the wideband differentiator 130 can have a FIR length, e.g., 11 taps, which is much smaller than the multi-band-stop FIR length. The integer delay 134 is used for delay matching.

Direct-form implementation of linear-phase FIR filters can utilize the coefficient symmetry to save half of the multipliers. Direct-form implementation is suitable for short to medium length FIR filtering. Multi-band filters often have FIR length greater than 100 taps. The overlap-add method using FFT is more efficient for long FIR filtering.

The present disclosure supports the sub-sampling of RF signals. In some examples, the estimator in FIG. 5B assumes that the RF-domain signal bands are all included within a Nyquist zone, e.g. the first-order, second-order, or third-order zone. The wideband differentiator 130 has Nyquist-zone dependent FIR coefficients. If the RF-domain signal bands are distributed among multiple Nyquist zones, a natural requirement is that the mappings of bands in the digital domain do not overlap with each other. When this is case, the original signal can be reconstructed from ADC data, and the estimator of in FIG. 5A is still valid.

The timing skew estimators of FIGS. 5A and 5B may fail to detect a special pattern of timing mismatch, such as $\tau_m = (-1)^m \theta$, when M is an even integer and the frequency band structure of the y(k) sequence has mirror-image symmetry with respect to $\tau/2$. This case may be recognized using PSD estimation.

Figure 6:
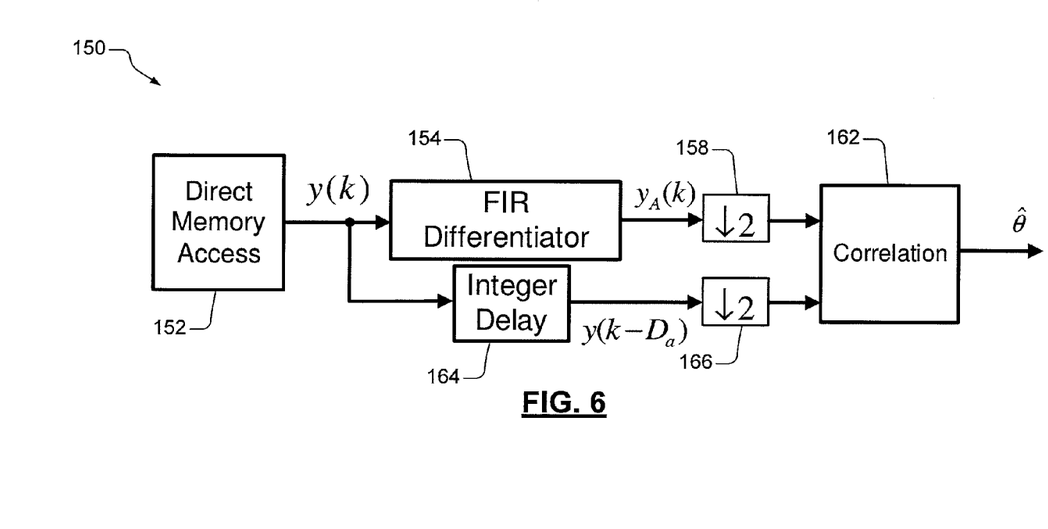

Referring now to FIG. 6, an alternate approach to skew detection is shown. A timing skew estimator 150 includes a direct memory access 152 that outputs an array y(k) to a FIR differentiator 154 (which outputs an array $y_A(k)$) and to an integer delay 164 (which outputs an array $y(k-D_a)$). The array $y_A(k)$ is input to a two-fold decimator 158 having an output connected to a correlation module 162. The array $y(k-D_a)$ is input to a two-fold decimator 166 having an output connected to the correlation module 162.

The FIR differentiator 154 (a type-III linear phase FIR) is either a multi-band differentiator or a wideband differentiator. The amplitude of alternating skew is a scalar θ, estimated as:

$$\hat{\theta} = \frac{1}{2} \frac{\text{Mean}_k\{y(2k-D_a)y_A(2k)\}}{\text{Mean}_k\{y_A^2(2k)\}} \quad (3)$$

where $D_a$ is the group delay of the FIR differentiator 154, $y_A(2k)$ is two-fold decimated differentiator output, and $y(2k-D_a)$ is two-fold decimated and delayed input.

Figure 7A:
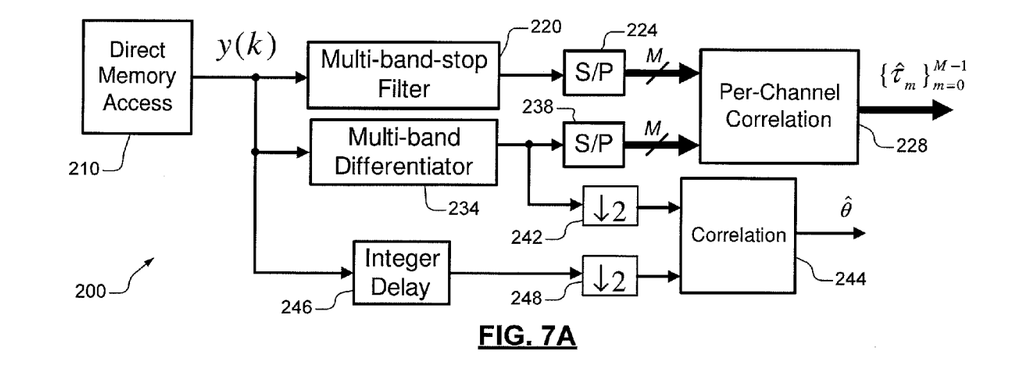
FIGS. 7A and 7B are functional block diagrams of examples of additional timing skew estimators according to the present disclosure.
Figure 7B:
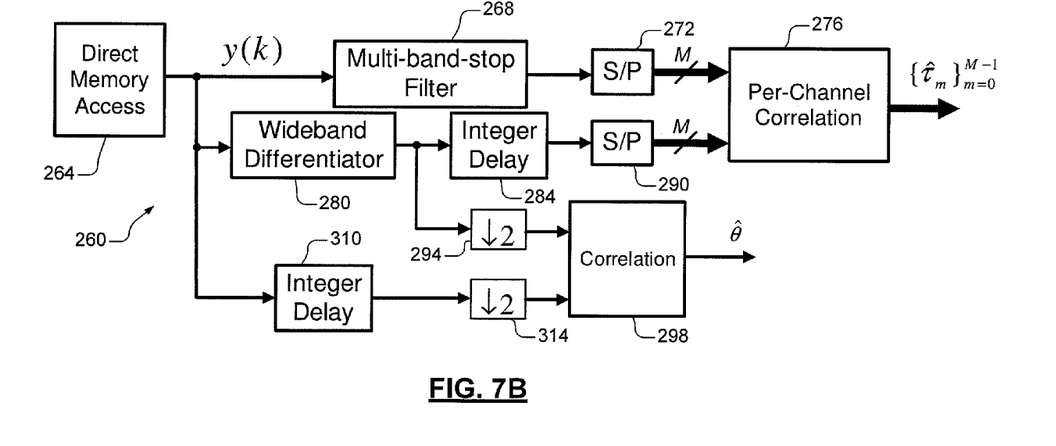

Referring now to FIGS. 7A and 7B, one approach combines the timing skew and alternating skew estimators into a single DSP module. Two embodiments of an enhanced timing skew estimator are shown in FIGS. 7A and 7B, respectively. Again, when a wideband differentiator is used, the assumption is the RF signal bands are confined within a single Nyquist zone.

In FIG. 7A, a timing skew estimator 200 includes a direct memory access 210 that outputs an array y(k) to a multi-band-stop filter 220. An output of the multi-band-stop filter 220 is input to a serial-to-parallel converter 224. An output of the serial-to-parallel converter 224 is input to a correlator 228. The array y(k) is also output to a multi-band differentiator 234. An output of the multi-band differentiator 234 is input to a serial-to-parallel converter 238 and to a two-fold decimator 242. An output of the serial-to-parallel converter 238 is input to the correlator 228. The output of the two-fold decimator 242 is input to a correlation module 244. The array y(k) is also output to an integer delay 246. An output of the integer delay 246 is input to a two-fold decimator 248, which has an output connected to the correlation module 244.

In FIG. 7B, a timing skew estimator 260 includes a direct memory access 264 that outputs an array y(k) to a multi-band-stop filter 268. An output of the multi-band-stop filter 268 is input to a serial-to-parallel converter 272. An output of the serial-to-parallel converter 272 is input to a correlator 276. The array y(k) is also output to a wideband differentiator 280. An output of the wideband differentiator 280 is input to an integer delay 284, which has an output connected to a serial-to-parallel converter 290. An output of the serial-to-parallel converter 290 is input to the correlator 276.

An output of the wideband differentiator 280 is also input to a two-fold decimator 294, which has an output connected to a correlator 298. The array y(k) is also output to an integer delay 310. An output of the integer delay 310 is input to a two-fold decimator 314, which has an output connected to the correlator 298.

Figure 8:
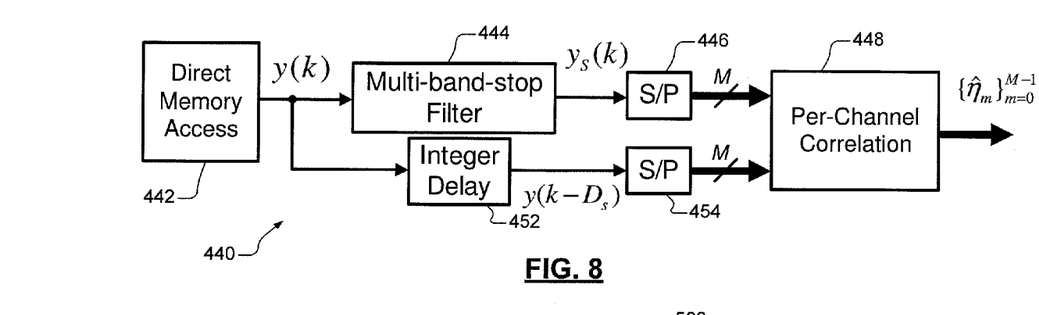
FIG. 8 is functional block diagram of an example of a gain mismatch estimator according to the present disclosure.

Referring now to FIG. 8, there are two methods for gain mismatch detection. One method uses the variances of data channels obtained from the per-channel mean-and-variance estimator. The other method uses the gain-mismatch estimator shown in FIG. 8, where the multi-band-stop filter (such as a type-I linear phase FIR) may be the same filter used in the timing estimator of FIGS. 5A and 5B.

In FIG. 8, a timing skew estimator 440 includes a direct memory access 442 that outputs an array y(k) to a multi-band-stop filter 444 (which outputs an array $y_S(k)$) and to an integer delay 452 (which outputs an array $y(k-D_a)$). The array $y_S(k)$ is input to a serial-to-parallel converter 446 having an output connected to a correlator 448. The array $y(k-D_a)$ is input to a serial-to-parallel converter 454 having an output connected to the correlator 448.

The output of the gain-mismatch estimator can be expressed as:

$$\hat{\eta}_m = \frac{\text{Mean}_i\{y_S(iM+m)y(iM+m-D_s)\}}{\text{Mean}_i\{y^2(iM+m-D_s)\}}, \quad (4)$$

for $m = 0, \ldots, M-1$ where $D_s$ is the group delay of the multi-band-stop filter, $y_S(k)$ is the filter output sequence. Estimated gain (in linear scale) of a sub-ADC channel is $1+\hat{\eta}_m$.

Embedded software on an embedded processor may be used for the real-time, digital control of interleaving error correction. There are three vector-valued control variables: the offset vector of per-channel offset corrector, the gain vector of per-channel gain corrector, and the DAC-input vector for sub-ADC timing control. The update interval of control variables may be the time duration of a buffering-processing cycle, i.e. $T_c$ in FIG. 3.

Figure 9A:
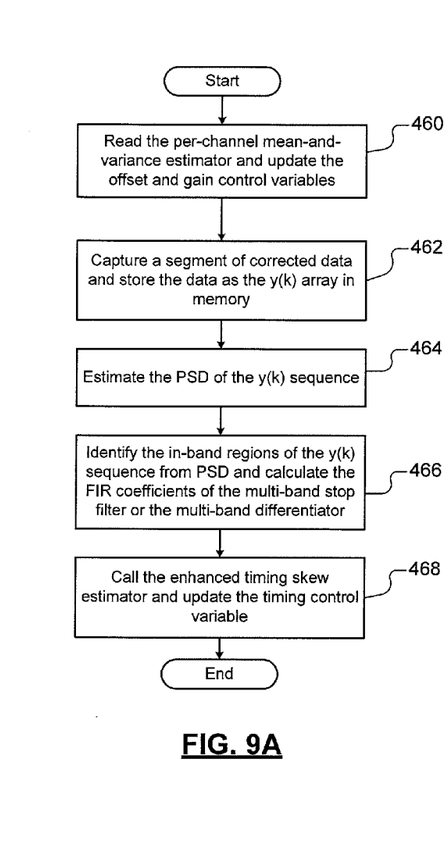
FIGS. 9A and 9B are flowcharts of methods for detecting gain-mismatch using different approaches.
Figure 9B:
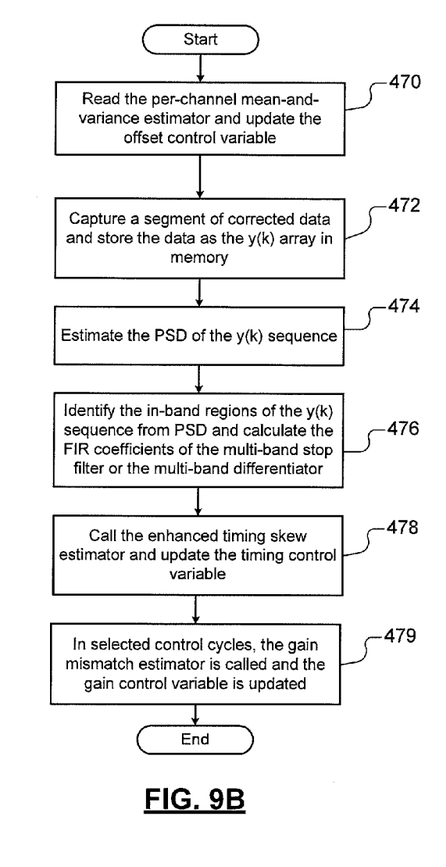

Referring now to FIGS. 9A and 9B, there are two control methods using different approaches to gain-mismatch detection. In one method in FIG. 9A, a control cycle includes the following stages: At 460, the per-channel mean-and-variance estimator is read and the offset and gain control variables are updated. Here, feedforward control is used for both offset and gain correction. At 462, a segment of corrected data is captured and a data is stored as the y(k) array in memory. At 464, the PSD of the y(k) sequence is estimated. At 466 the in-band regions of the y(k) sequence from PSD are identified and the FIR coefficients of the multi-band-stop filter and/or the multi-band differentiator are calculated. At 468, the enhanced timing skew estimator is called and the timing control variable is updated.

This method uses feedback timing control. The timing control variable, denoted by $\{\tau_m\}_{m=0}^{M-1}$, can be updated as follows:

$$r_m = t_m - \mu_1 \hat{\tau}_m, \text{ for } m=0,\ldots,M-1 \quad (5a)$$

$$\rho = M^{-1} \sum_{m=0}^{M-1} r_m \quad (5b)$$

$$\begin{cases} t_m = r_m - \rho - \mu_2(-1)^m \hat{\theta}, & \text{pathological case} \\ t_m = r_m - \rho, & \text{otherwise} \end{cases} \quad (5c)$$

for $m = 0, \ldots, M-1$ where $\hat{\tau}_m$ and $\hat{\theta}$ are outputs of the enhanced timing skew estimator, $\mu_1$ and $\mu_2$ are two adaptation parameters ($\mu_2$ is used only in the pathological case). Note that $\hat{\theta}$ has much higher statistical fluctuations than $\hat{\tau}_m$ due to self-noise. Therefore, $\mu_2/\mu_1 \ll 1$ is required.

In another control method in FIG. 9B, a control cycle includes the following steps. At 470, the per-channel mean-and-variance estimator is read and the offset control variable is updated. Here, feedforward control is used for offset correction only. At 472, a segment of corrected data is captured and the data is stored as the y(k) array in memory. At 474, the PSD of the y(k) sequence is estimated. At 476, the in-band regions of the y(k) sequence from PSD are identified and the FIR coefficients of the multi-band-stop filter and/or the multi-band differentiator are calculated. At 478, the enhanced timing skew estimator is called and the timing control variable is updated. In selected control cycles (e.g. every 6 cycles), the gain mismatch estimator is called and the gain control variable is updated at 479. Note that the multi-band-stop filter output has been computed and saved in memory.

The control method in FIG. 9B uses feedback control for both timing and gain correction. The timing control variable is updated in the same way as (5a)-(5c). The gain control variable, denoted by $\{g_m\}_{m=0}^{M-1}$, can be updated as follows:

$$r_m = g_m - \mu_1 \hat{\eta}_m, \text{ for } m=0,\ldots,M-1 \quad (6a)$$

$$\rho = M^{-1} \sum_{m=0}^{M-1} r_m \quad (6b)$$

$$g_m = r_m - \rho, \text{ for } m=0,\ldots,M-1 \quad (6c)$$

where $\hat{\eta}_m$ is the gain-mismatch estimator output.

Figure 10:
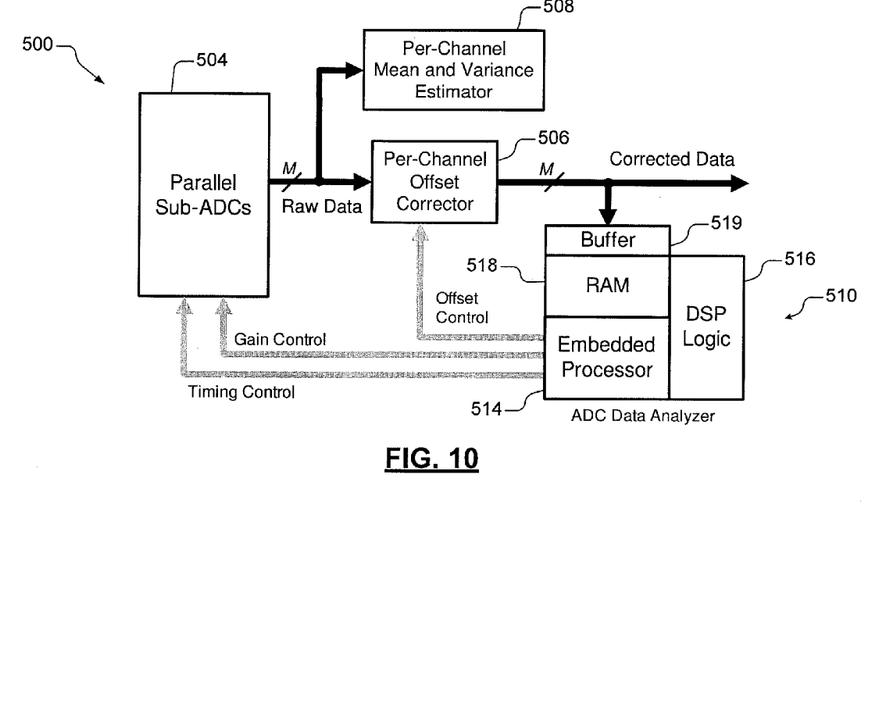
FIG. 10 is a functional block diagram of another example of an ADC system according to the present disclosure.

Referring now to FIG. 10, a variation of the analog-to-digital converter system is shown. An ADC system 500 includes M parallel sub-ADCs that output the M sets of raw data to an offset corrector 506 and to a mean-and-variance estimator 508. The offset corrector 506 outputs M sets of corrected data. An ADC data analyzer 510 receives the M sets of corrected data from the offset corrector 506 and generates a timing control signal, a gain control signal, and an offset control signal. The ADC data analyzer 510 may include a DSP logic 516, an embedded processor 514, RAM 518, and a buffer 519. The timing control signal and the gain control signal are input to the parallel sub-ADCs 504. The offset control signal is input to the offset corrector 506.

The sub-ADCs 504 can support not only timing adjustment but also gain adjustment. Variable sub-ADC gains may be achieved by using DAC-controlled reference voltages. Three vector-valued control variables include the offset vector of per-channel offset corrector, the DAC-input vector for sub-ADC gain control, and the DAC-input vector for sub-ADC timing control. The system requires feedback control on both gain and timing. The second control method can be directly used here.

In a shared sampler architecture, the sub-ADCs are divided into a number of groups, and each group of sub-ADCs is driven by a common sample-and-hold amplifier. For example, M sub-ADCs are divided into M/n groups, with n a small integer such as 2 or 4. The sampling rate of each sample-and-hold block is $nF_s/M$. There are M/n sample-and-hold amplifiers and hence M/n timing skew parameters. Correspondingly, in timing skew detection (FIG. 4, 5, or 7), the output size of the S/P blocks should be changed from M to M/n.

In the shared sampler architecture, the pathological case of the timing skew estimator can be eliminated by selecting M/n as an odd number. For example, take n=2 and M=6. This observation shows an advantage of not using a power-of-2 number of sub-ADCs.

Blind detection of sub-ADC mismatches has limitations. For example, per-channel mean-and-variance estimator fails to detect the offset mismatch if the ADC input signal contains continuous wave (CW) tones located exactly at a multiple of $F_s/M$. In many applications, those limitations can be avoided by properly selecting the ADC sampling rate. The ADC sampling clock is generated from a phase-locked-loop (PLL) frequency synthesizer using the fractional-N architecture.

Figure 11:
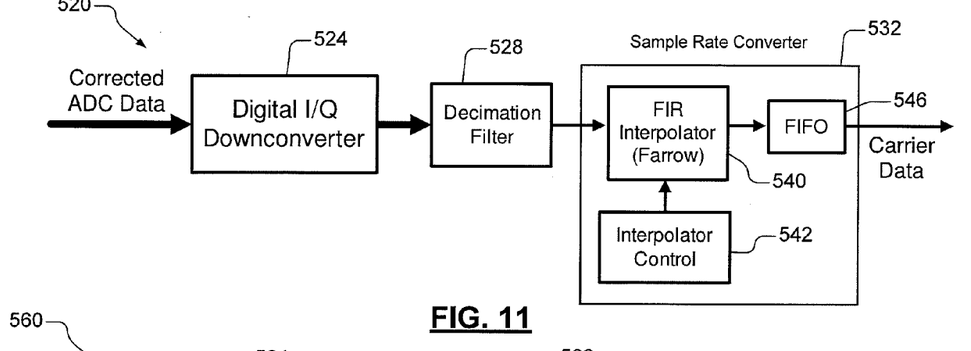
FIG. 11 is a functional block diagram of a sample rate converter according to the present disclosure.

Referring now to FIG. 11, digital quadrature downconverters and decimation filters may be used at ADC output to select a number of carriers at different center frequencies. The polyphase FIR filters and the cascaded-integrator-comb filters may be used as decimation filters and may have integer decimation factors. In some applications, the sampling rate of an output carrier is required to be a fixed number, e.g. 30.72 MS/s for a 20-MHz LTE carrier. With integer decimation factors, the ADC sampling rate may be an integer multiple of the carrier sampling rate.

In order to have more flexibility in the selection of ADC rates, a digital sample rate converter is cascaded with a decimation filter. A digital sample rate converter 520 receives corrected ADC data at a digital in-phase and quadrature (I/Q) down converter 524. An output of the (I/Q) down converter 524 is input to a decimation filter 528. A sample rate converter 532 receives an output of the decimation filter at a FIR interpolator 540. An interpolator control module 542 controls the FIR interpolator 540. An output of the FIR interpolator 540 is input to a buffer 546 such as a first-in first-out buffer. The buffer 546 outputs carrier data.

The sample rate converter 532 uses a polynomial-coefficients FIR interpolator in a Farrow structure and a first-in-first-out (FIFO) buffer. The Farrow structure is used for implementing the time-varying fractional-delay FIR.

In the presence of sample rate conversion, the ADC data analyzer can even recognize the difficult cases for blind detection and change the ADC sampling rate whenever necessary. In most cases, the limitations on blind detection of sub-ADC mismatches can be avoided by a very small variation, e.g. 10~50 ppm, of the sampling rate. The data conversion is interrupted only during the transient time of synthesizer switching. Because the relative variation of synthesizer frequency is small, the switching time may be less than 1 millisecond.

Note that there is only one voltage-controlled oscillator (VCO) running on the ADC chip. The low-jitter, phase locked VCO is frequency divided to generate ADC sampling clocks. The output stage of a sample rate converter works at a clock frequency slightly different than the converter input stage.

Figure 12:
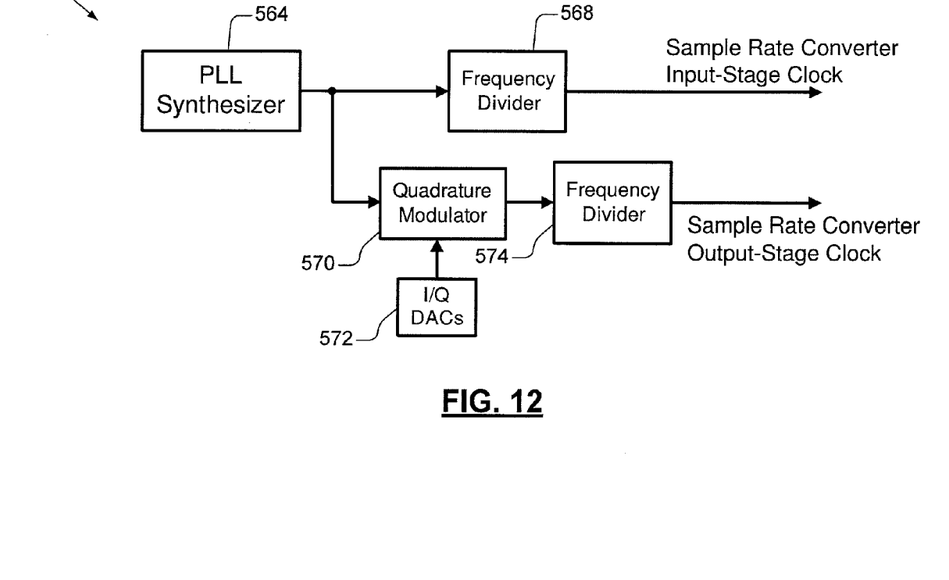
FIG. 12 is a functional block diagram of a clock generator for a sample rate converter according to the present disclosure.

Referring now to FIG. 12, a clock generation circuit 560 for the sample rate converter 532 is shown. The clock generation circuit 560 includes a phase-locked-loop synthesizer 564 having an output connected to a frequency divider 568 and a quadrature modulator 570. The frequency divider 568 outputs a sample rate converter input-stage clock. The quadrature modulator 570 receives an output from I/Q digital-to-analog converters (DACs) 572. An output of the quadrature modulator 570 is input to a frequency divider 574, which outputs a sample rate converter output-stage clock.

The quadrature modulator 570 is used to shift the frequency of a RF sinusoidal signal. For example, the modulator input (or VCO output) is $\sin(2\pi ft+\phi)$, the modulator I/Q DAC outputs are $\cos(2\pi\Delta t)$ and $\sin(2\pi\Delta t)$, respectively, and the modulator output is $\sin[2\pi(f+\Delta)t+\phi]$. This method can readily provide up to 1000 ppm frequency shift of a multi-GHz sinusoid. It can be shown that the jitter of frequency shifted signal arising from modulator I/Q imbalance is not a problem.

Calibration can be performed during hard reset (or power up) operations and during the gaps between burst-mode data conversions in some applications, for example, the observation receiver of power amplified RF transmitters. In addition, most applications allow for one calibration every 24 hours. Without using a calibration signal source, the differential inputs to ADC can be simply shorted to detect the offset mismatch. The gain mismatch may be detected with ~0.01 dB accuracy from the thermal noise when ADC inputs are shorted.

In another method that does not use a calibration signal source, the ADC sampling rate is switched to one or more values different than the normal rate. The mismatches may be identified by comparing the blind detection results at different sampling rates. After calibration, the ADC sampling rate is switched back to the normal value, if the sample rate conversion in FIG. 12 is not employed.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A system comprising:
    an interleaved analog-to-digital converter (ADC) comprising a plurality of sub-ADCs, wherein each of the plurality of sub-ADCs has an adjustable timing and gain; and
    a data analyzer that analyzes an output of the interleaved ADC, that estimates timing and gain mismatches of the plurality of sub-ADCs, and that corrects the timing and gain mismatches by adjusting the adjustable timing and gain of one or more of the plurality of sub-ADCs based on the estimated timing and gain mismatches.

2. The system of claim 1 wherein the data analyzer comprises:
    a first linear phase finite impulse response (FIR) filter having symmetric coefficients that receives the output of the interleaved ADC and that generates a first filtered output;
    a second linear phase FIR filter having asymmetric coefficients that receives the output of the interleaved ADC and that generates a second filtered output; and
    a correlator that generates the estimated timing mismatches based on the first and second filtered outputs.

3. The system of claim 2 wherein the first and second linear phase FIR filters have an odd number FIR length, wherein the second linear phase FIR filter has a shorter FIR length than the first linear phase FIR filter, and wherein the data analyzer delays the second filtered output by an integer number of samples to synchronize the first and second filtered outputs.

4. The system of claim 1 wherein the data analyzer comprises:
    a multi-band-stop filter having symmetric coefficients that receives the output of the interleaved ADC, that selects one or more out-of-band components of output of the interleaved ADC, and that generates a first output; and
    a multi-band differentiator having asymmetric coefficients that receives the output of the interleaved ADC, that rejects the one or more out-of-band components of the output of the interleaved ADC, that shifts a phase of one or more in-band components of the output of the interleaved ADC, and that generates a second output; and
    a correlator that generates the estimated timing mismatches based on the first and second outputs.

5. The system of claim 4 wherein the multi-band-stop filter and the multi-band differentiator have the same finite impulse response (FIR) length and wherein the second output includes a derivative an input of the interleaved ADC.

6. The system of claim 1 wherein the data analyzer comprises:
    a multi-band-stop filter having symmetric coefficients that receives the output of the interleaved ADC, that selects out-of-band components of output of the interleaved ADC, and that generates a first output; and
    a wideband differentiator having asymmetric coefficients that receives the output of the interleaved ADC and that generates a second output; and
    a correlator that generates the estimated timing mismatches based on the first and second outputs.

7. The system of claim 6 wherein the wideband differentiator has a shorter finite impulse response (FIR) length than the multi-band-stop filter, and wherein the data analyzer delays the second output by an integer number of samples to synchronize the first and second outputs.

8. The system of claim 1 wherein the data analyzer comprises:
    a finite impulse response (FIR) differentiator having asymmetric coefficients that receives the output of the interleaved ADC and that generates a first output; and
    a correlator that generates the estimated timing mismatches based on the first output and a delayed output of the interleaved ADC,
    wherein the data analyzer generates the delayed output by delaying the output of the interleaved ADC by an integer number of samples.

9. The system of claim 8 wherein the FIR differentiator includes a multi-band differentiator that rejects out-of-band components of the output of the interleaved ADC and that shifts a phase of in-band components of the output of the interleaved ADC.

10. The system of claim 8 wherein the FIR differentiator includes a wideband differentiator in response to bands of an input of the interleaved ADC being within a single Nyquist zone.

11. The system of claim 1 wherein the data analyzer comprises:
    a multi-band-stop filter having symmetric coefficients that receives the output of the interleaved ADC, that selects one or more out-of-band components of output of the interleaved ADC, and that generates a first output;
a multi-band differentiator having asymmetric coefficients that receives the output of the interleaved ADC, that rejects the one or more out-of-band components of the output of the interleaved ADC, that shifts a phase of one or more in-band components of the output of the interleaved ADC, and that generates a second output;
a first correlator that generates the estimated timing mismatches based on the first and second outputs; and
a second correlator that generates the estimated timing mismatches based on the second output and a delayed output of the interleaved ADC in response to bands of an input of the interleaved ADC being within a single Nyquist zone,
wherein the data analyzer generates the delayed output by delaying the output of the interleaved ADC by an integer number of samples.

12. The system of claim 1 wherein the data analyzer comprises:
a multi-band-stop filter having symmetric coefficients that receives the output of the interleaved ADC, that selects out-of-band components of output of the interleaved ADC, and that generates a first output;
a wideband differentiator having asymmetric coefficients that receives the output of the interleaved ADC and that generates a second output;
a first correlator that generates the estimated timing mismatches based on the first and second outputs; and
a second correlator that generates the estimated timing mismatches based on the second output and a delayed output of the interleaved ADC in response to bands of an input of the interleaved ADC being within a single Nyquist zone,
wherein the data analyzer generates the delayed output by delaying the output of the interleaved ADC by an integer number of samples.

13. The system of claim 1 wherein the data analyzer comprises:
a multi-band-stop filter having symmetric coefficients that receives the output of the interleaved ADC, that selects out-of-band components of output of the interleaved ADC, and that generates a first output; and
a correlator that estimates a gain mismatch of the plurality of sub-ADCs based on the first output and a delayed output of the interleaved ADC,
wherein the data analyzer generates the delayed output by delaying the output of the interleaved ADC by an integer number of samples.

14. The system of claim 1 wherein the interleaved ADC samples an input at a sampling frequency, the system further comprising:
a converter that converts the sampling frequency into a predetermined frequency and that changes the sampling frequency without changing the predetermined frequency in response to the input including an unwanted signal at a multiple of the sampling frequency.

15. The system of claim 14 wherein the converter changes the sampling frequency by a predetermined amount, the system further comprising:
a phase-locked loop (PLL) frequency synthesizer that includes a voltage controlled oscillator (VCO) to generate clock signals for the interleaved ADC and the converter;
a first frequency divider that divides an output of the PLL frequency synthesizer by a predetermined value to generate a first clock signal for the converter;
a frequency shifter that shifts a frequency of the output of the PLL frequency synthesizer by a predetermined amount; and
a second frequency divider that divides an output of the frequency shifter by the predetermined value to generate a second clock signal for the converter.

16. A method comprising:
analyzing an output of an interleaved analog-to-digital converter (ADC) comprising a plurality of sub-ADCs, wherein each of the plurality of sub-ADCs has an adjustable timing and gain;
estimating timing and gain mismatches of the plurality of sub-ADCs based on the analyzing of the output of the interleaved ADC; and
correcting the timing and gain mismatches by adjusting the adjustable timing and gain of one or more of the plurality of sub-ADCs based on the estimated timing and gain mismatches.

17. The method of claim 16 wherein the analyzing of the output of the interleaved ADC comprises:
filtering the output of the interleaved ADC using a first filter to generate a first filtered output;
filtering the output of the interleaved ADC using a second filter to generate a second filtered output; and
correlating the first and second filtered outputs to generate the estimated timing mismatches,
wherein the first and second filters include first and second linear phase finite impulse response (FIR) filter having symmetric and asymmetric coefficients; or
wherein the first and second filters respectively include a multi-band-stop filter having symmetric coefficients that selects one or more out-of-band components of output of the interleaved ADC, and a second linear phase finite impulse response (FIR) filter having symmetric and asymmetric coefficients that rejects the one or more out-of-band components of the output of the interleaved ADC and that shifts a phase of one or more in-band components of the output of the interleaved ADC; or
wherein the first and second filters respectively include a multi-band-stop filter having symmetric coefficients that selects out-of-band components of output of the interleaved ADC and a wideband differentiator having asymmetric coefficients.

18. The method of claim 16 wherein the analyzing of the output of the interleaved ADC comprises:
filtering the output of the interleaved ADC using a finite impulse response (FIR) differentiator having asymmetric coefficients to generate a first output; and
correlating the first output and a delayed output of the interleaved ADC to generate the estimated timing mismatches,
wherein the FIR differentiator includes a multi-band differentiator that rejects out-of-band components of the output of the interleaved ADC and that shifts a phase of in-band components of the output of the interleaved ADC; or
wherein the FIR differentiator includes a wideband differentiator in response to bands of an input of the interleaved ADC being within a single Nyquist zone.

19. The method of claim 16 wherein the analyzing of the output of the interleaved ADC comprises:
filtering the output of the interleaved ADC using a multi-band-stop filter having symmetric coefficients that selects one or more out-of-band components of output of the interleaved ADC to generate a first output;
filtering the output of the interleaved ADC using a multi-band differentiator having asymmetric coefficients that rejects the one or more out-of-band components of the output of the interleaved ADC and that shifts a phase of one or more in-band components of the output of the interleaved ADC to generate a second output;

correlating the first and second outputs to generate the estimated timing mismatches; and correlating, in response to bands of an input of the interleaved ADC being within a single Nyquist zone, the second output and a delayed output of the interleaved ADC to generate the estimated timing mismatches.

20. The method of claim 16 wherein the analyzing of the output of the interleaved ADC comprises:

filtering the output of the interleaved ADC using a multi-band-stop filter having symmetric coefficients that selects out-of-band components of output of the interleaved ADC to generate a first output;

filtering the output of the interleaved ADC using a wideband differentiator having asymmetric coefficients to generate a second output;

correlating the first and second outputs to generate the estimated timing mismatches; and correlating, in response to bands of an input of the interleaved ADC being within a single Nyquist zone, the second output and a delayed output of the interleaved ADC to generate the estimated timing mismatches.

21. The method of claim 16 wherein the analyzing of the output of the interleaved ADC comprises:

filtering the output of the interleaved ADC using a multi-band-stop filter having symmetric coefficients that selects out-of-band components of output of the interleaved ADC to generate a first output; and correlating the first output and a delayed output of the interleaved ADC to estimate a gain mismatch of the plurality of sub-ADCs.

22. The method of claim 16 wherein the interleaved ADC samples an input at a sampling frequency, the method further comprising:

converting the sampling frequency into a predetermined frequency; and changing the sampling frequency without changing the predetermined frequency in response to the input including an unwanted signal at a multiple of the sampling frequency.

23. The method of claim 22 further comprising:

dividing an output of a phase-locked loop (PLL) frequency synthesizer by a predetermined value to generate a first clock signal for a converter that changes the sampling frequency; and generating a second clock signal for the interleaved ADC by shifting a frequency of the output of the PLL frequency synthesizer by a predetermined amount and dividing the frequency-shifted output of the PLL frequency synthesizer by the predetermined value.

* * * * *